United States Patent
Neag et al.

(10) Patent No.: US 10,177,752 B2
(45) Date of Patent: Jan. 8, 2019

(54) FREQUENCY COMPARATOR AND EARLY-LATE DETECTOR

(71) Applicant: DecaWave Ltd., Dublin (IE)

(72) Inventors: Marius-Gheorghe Neag, Cluj-Napoca (RO); Mici McCullagh, Dublin (IE); Gavin Marow, Dublin (IE); Michael McLaughlin, Dublin (IE); Istvan Kovacs, Cluj-Napoca (RO)

(73) Assignee: DecaWave, Ltd., Dublin (IE)

( * ) Notice: Subject to any disclaimer, the term of this patent is extended or adjusted under 35 U.S.C. 154(b) by 0 days.

(21) Appl. No.: 14/983,027

(22) Filed: Dec. 29, 2015

(65) Prior Publication Data

US 2016/0191035 A1   Jun. 30, 2016

Related U.S. Application Data

(60) Provisional application No. 62/096,869, filed on Dec. 25, 2014.

(51) Int. Cl.
| | |
|---|---|
| *H03K 5/26* | (2006.01) |
| *H03L 7/07* | (2006.01) |
| *H03L 7/18* | (2006.01) |
| *H04B 1/7183* | (2011.01) |

(52) U.S. Cl.
CPC ............... *H03K 5/26* (2013.01); *H03L 7/07* (2013.01); *H03L 7/18* (2013.01); *H04B 1/7183* (2013.01)

(58) Field of Classification Search
CPC .. H03K 3/0315; H03K 17/005; H03K 17/602; H03K 3/012; H03K 7/06; H03L 1/02; H03L 7/099; H03L 1/026
USPC .................................................. 327/8, 39, 40
See application file for complete search history.

(56) References Cited

U.S. PATENT DOCUMENTS

| | | | |
|---|---|---|---|
| 5,477,177 | A | 12/1995 | Wong |
| 7,719,373 | B2 | 4/2010 | Ryckaert |
| 8,244,562 | B2 | 8/2012 | Kamal |
| 2007/0257709 | A1 | 11/2007 | Han |

(Continued)

FOREIGN PATENT DOCUMENTS

| | | |
|---|---|---|
| EP | 1916768 A1 | 4/2008 |
| EP | 1916769 B1 | 1/2010 |

OTHER PUBLICATIONS

Ryckaert, "A 0.65-to-1.4 nJ/Burst 3-to-10 GHz UWB All-Digital TX in 90 nm CMOS for IEEE 802.15.4a", IEEE JSSC, vol. 42, No. 12, pp. 2860-2869, Dec. 2007.

*Primary Examiner* — John W Poos
(74) *Attorney, Agent, or Firm* — Hunt Pennington Kumar & Dula, PLLC; Artie Pennington; Jeffrey Van Myers

(57) ABSTRACT

In a receiver facility in an ultra-wideband communication system, a dual-mode circuit adapted to operate in a selected one of three operating modes without changes in circuit topology: a calibration mode adapted to render the circuit substantially independent of circuit component mismatches; a frequency comparator mode adapted to indicate whether the frequency of a first periodic signal is larger or smaller than the frequency of a second periodic signal; and an early-late detector mode adapted to indicate whether the $1^{st}$ rising edge of the first periodic signal arrived sooner or later than the $1^{st}$ rising edge of the second periodic signal applied.

13 Claims, 9 Drawing Sheets

(56) References Cited

U.S. PATENT DOCUMENTS

2014/0176250 A1* 6/2014 Thomsen ............. H03K 3/0231
331/143

* cited by examiner

FREQUENCY COMPARATOR AND EARLY-LATE DETECTOR

CROSS-REFERENCE TO RELATED APPLICATIONS

This application is related to Provisional Application Ser. No. 62/096,869, filed 25 Dec. 2014 ("Parent Provisional Application"), and hereby claims benefit of the filing date thereof pursuant to 37 CFR § 1.78(a)(4).

The subject matter of this Application is also related to the subject matter of:
1. PCT/EP2015/063661, filed 17 Jun. 2015 ("Related Application 1"); and
2. PCT/GB2014/052677, filed 4 Sep. 2014 ("Related Application 2").

The subject matter of the Parent Provisional Application, and the Related Applications (collectively, "Related References"), each in its entirety, is expressly incorporated herein by reference.

BACKGROUND OF THE INVENTION

1. Field of the Invention

The present invention relates generally to an ultra-wideband ("UWB") communication system, and, in particular, to an improved dual-mode frequency comparator and early-late detector for use in a UWB communication system.

2. Description of the Related Art

In general, in the descriptions that follow, we will italicize the first occurrence of each special term of art that should be familiar to those skilled in the art of integrated circuits ("ICs") and systems. In addition, when we first introduce a term that we believe to be new or that we will use in a context that we believe to be new, we will bold the term and provide the definition that we intend to apply to that term. In addition, throughout this description, we will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, we may refer to the mutually exclusive boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, when we refer to a facility we mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single IC, or distributed across multiple ICs. Depending on cost and other known considerations, the electronic components, including the facility-instantiating IC(s), may be embodied in one or more single- or multi-chip packages. However, unless we expressly state to the contrary, we consider the form of instantiation of any facility that practices our invention as being purely a matter of design choice.

Shown in FIG. 1 is a UWB transceiver substantially as presented in FIG. 27a, "PHY signal flow", on page 63 of the IEEE 802.15.4a-2007, the entirety of which is hereby expressly incorporated herein by reference (hereinafter "Standard"). In general, the construction and operation of the transceiver are disclosed in the Related Application 1. Shown in FIG. 2 is one embodiment of a UWB receiver adapted for use in the transceiver. In general, the construction and operation of the receiver are disclosed in the Related Application 2.

In general, UWB receivers incorporate circuits for detecting the frequency difference between a received signal and an internally generated reference signal. In addition, such receivers typically incorporate separate circuits for detecting the relative times of arrival of the leading/trailing edges of pulses of such pairs of signals. The following prior art embodiments of such circuits are known to us:
1. European Patent No. EP1916768A1, issued 30 Apr. 2008;
2. European Patent No. EP1916769B1, issued 13 Jan. 2010;
3. U.S. Pat. No. 7,719,373, issued 18 Apr. 2010;
4. US Patent Publication No. 2007/0257709, published 8 Nov. 2007;
5. U.S. Pat. No. 5,477,177, issued 19 Dec. 1995; and
6. J. Ryckaert, et al., "*A 0.65-to-1.4 nJ per Burst 3-to-10 GHz UWB All-Digital TX in 90 nm for IEEE 802.15.4a*", IEEE ISSCC Dig. Tech. Papers, February 2007, pp. 120-121.

We submit that what is needed is a single circuit able to operate both as a frequency comparator and as an early-late detector without changes in its topology. In particular, when operating as a frequency comparator the state of the digital output of the circuit should indicate which of the two periodical signals applied at its inputs has a larger period/frequency; when operating as an early-late detector the state of the digital output of the circuit should indicate which of the two signals applied at its inputs presented first a rising or a falling edge. Further, we submit that a need exists for a calibration circuit for this dual-function circuit which significantly reduces the impact several non-idealities inherent to the physical implementation of the dual-function circuit may have on its operation. As a result, after calibration, the response of the dual-function circuit will not depend on circuit component (e.g., capacitors, switches) mismatches or on the offset voltage associated with a differential-input amplifier or comparator.

BRIEF SUMMARY OF THE INVENTION

In one embodiment of our invention, we provide a method for operating a dual-function circuit in a selected one of a frequency calibration mode and an early-late detector mode.

In the frequency calibration mode, a first capacitor is connected to a first charge source in response to a first pulse of a first periodic signal, and a second capacitor is connected to a second charge source in response to a first pulse of a second periodic signal. An output is then developed as a function of the respective charges on the first and second capacitors. The first capacitor is then disconnected from the first charge source after K pulses of the first signal, and the second capacitor is disconnected from the second charge source after K pulses of the second signal. The output is indicative of the difference between the periods of the first and second signals; and In the early-late detector mode, a first capacitor is connected to a first charge source in response to a first pulse of a first periodic signal, and a second capacitor is connected to a second charge source in response to a first pulse of a second periodic signal. An output is then developed as a function of the respective charges on the first and second capacitors. Then, both the first capacitor is disconnected from the first charge source and the second capacitor is disconnected from the second charge source after the earliest $(K+1)^{th}$ pulse of the first and second signals. The output is indicative of the difference in time between the first pulses of the first and second signals.

In either the frequency comparator mode or the early-late detector mode, the second charge source may first be calibrated with respect to the first charge source.

BRIEF DESCRIPTION OF THE SEVERAL VIEWS OF THE DRAWINGS

Our invention may be more fully understood by a description of certain preferred embodiments in conjunction with the attached drawings in which:

FIG. 8, comprising

FIG. 11, comprising

Figure 1:
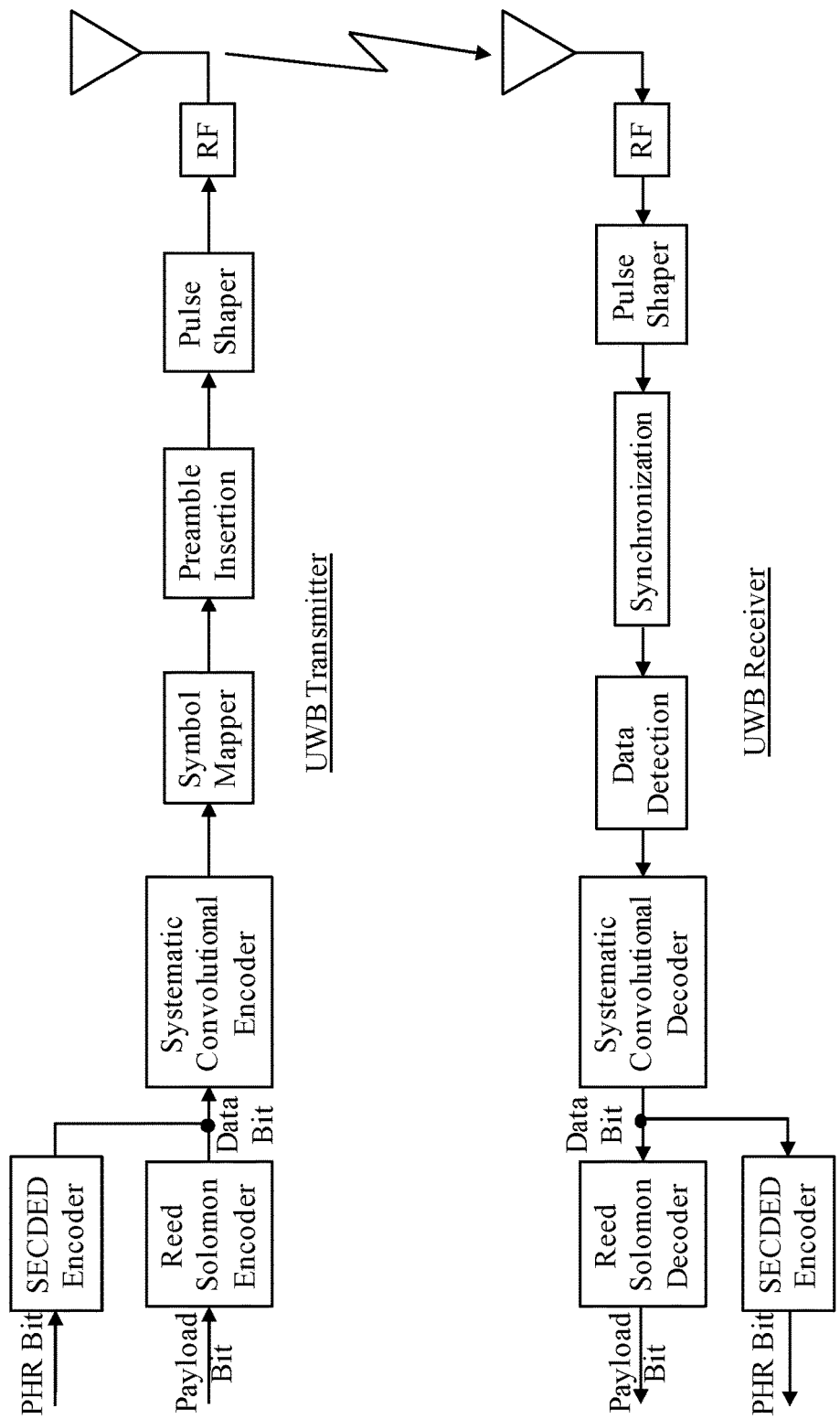
FIG. 1 illustrates, in block diagram form, an UWB communication transceiver.
Figure 2:
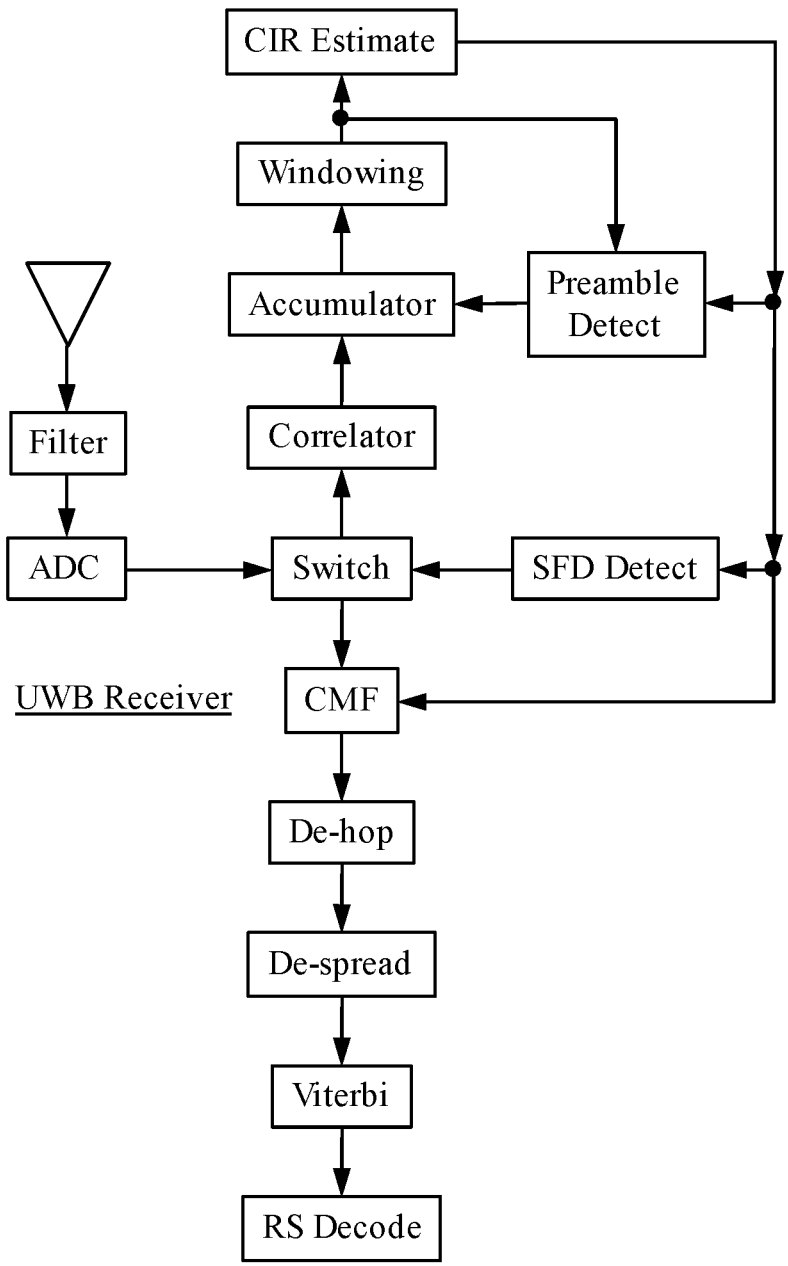
FIG. 2 illustrates, in block diagram form, one embodiment of the receiver shown in FIG. 1.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

Figure 3:
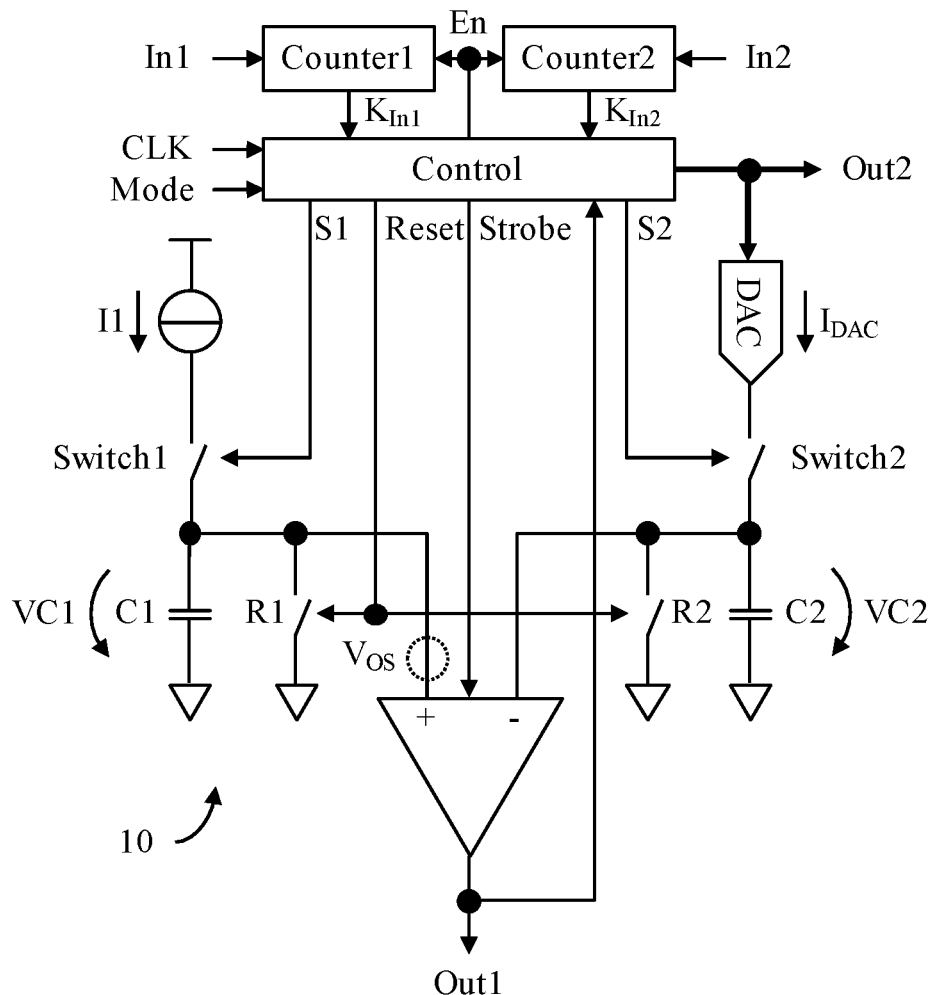
FIG. 3 illustrates, in circuit diagram form, one embodiment of a dual-function frequency comparator and early-late detector, constructed in accordance with one embodiment of our invention.

Shown in FIG. 3 is one embodiment of a dual-function frequency comparator and early-late detector circuit 10 constructed in accordance with our invention. In general, circuit 10 has two signal inputs, In1 and In2, and two digital outputs:
1. A single-bit Out1, the logic state of which indicates, depending on the mode of operation for which the circuit is set, either:
   1.1. the sign of the phase difference between the signals applied at the inputs; or
   1.2. the sign of frequency difference between the signals applied at the inputs; and
2. A multi-bit Out2, the value of which, in one operating mode, comprises a digital word proportional to the difference between the periods of the signals applied at inputs.

A pair of digital blocks, Counter1 and Counter2, each responsive to a respective one of the applied inputs, assert respective outputs, $K_{In1}$ and $K_{In2}$, on the first rising edge of the signal applied to that input and remain asserted until the arrival of the $(K+1)^{th}$ rising edge of that signal. Thus, for example, the output $K_{In1}$ of Counter 1 remains asserted for the duration of K periods of the signal applied to In1.

The current source I1 charges the capacitor C1 when the switch Switch1 is turned ON; similarly, the current-output digital-to-analog converter ("DAC") charges the capacitor C2, which has the same (within the process tolerances) value as C1, when the switch Switch2 is turned ON.

A voltage comparator receives each of the voltages developed on the two capacitors, C1 and C2, and develops an output, Out1, the value of which indicates which one is greater: Out1=>High if $V_{C1}$ is larger than $V_{C2}$; and Out1=>Low if $V_{C1}$ is smaller than $V_{C2}$. As is known, typical instantiations of voltage comparators exhibit an inherent input offset voltage, which we have depicted in FIG. 3 as $V_{OS}$.

A digital control facility, Control, receives the $K_{In1}$ and $K_{In2}$ signals, as well as the Out1 signal; it also receives a digital clock, CLK, and a Mode control signal, the value of which sets the operating mode of the circuit 10. The Control performs several important control functions:
1. to generate a Reset signal that controls reset switches, R1 and R2, selectively to discharge the capacitors C1 and C2;
2. to generate the signals for controlling the current switches Switch1 and Switch2;
3. to generate, selectively, a second output signal, Out2, the value of which determines the amount of current, $I_{DAC}$, generated by the DAC;
4. to generate the STROBE control of the comparator, thus selecting the moment in time the comparator may change the state of its output, Out2, if so required by the voltage levels at its inputs at that moment;
5. to enable the operation of Counter1 and Counter2, thus selecting the moment in time each initiates counting of the pulses applied to inputs In1 and In2, respectively; and
6. to drive the search for the appropriate DAC control word, Out2, during the calibration mode, and then to provide that control word in the other modes of operation.

Figure 4:
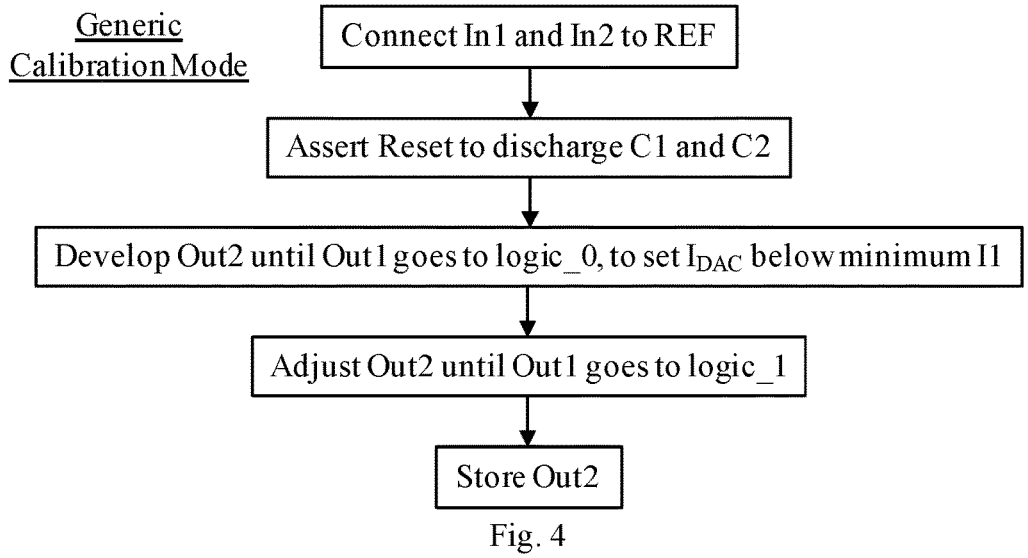
FIG. 4 illustrates, in flow diagram form, a generic form of a calibration mode of operation of the dual-function circuit of FIG. 3.
Figure 5:
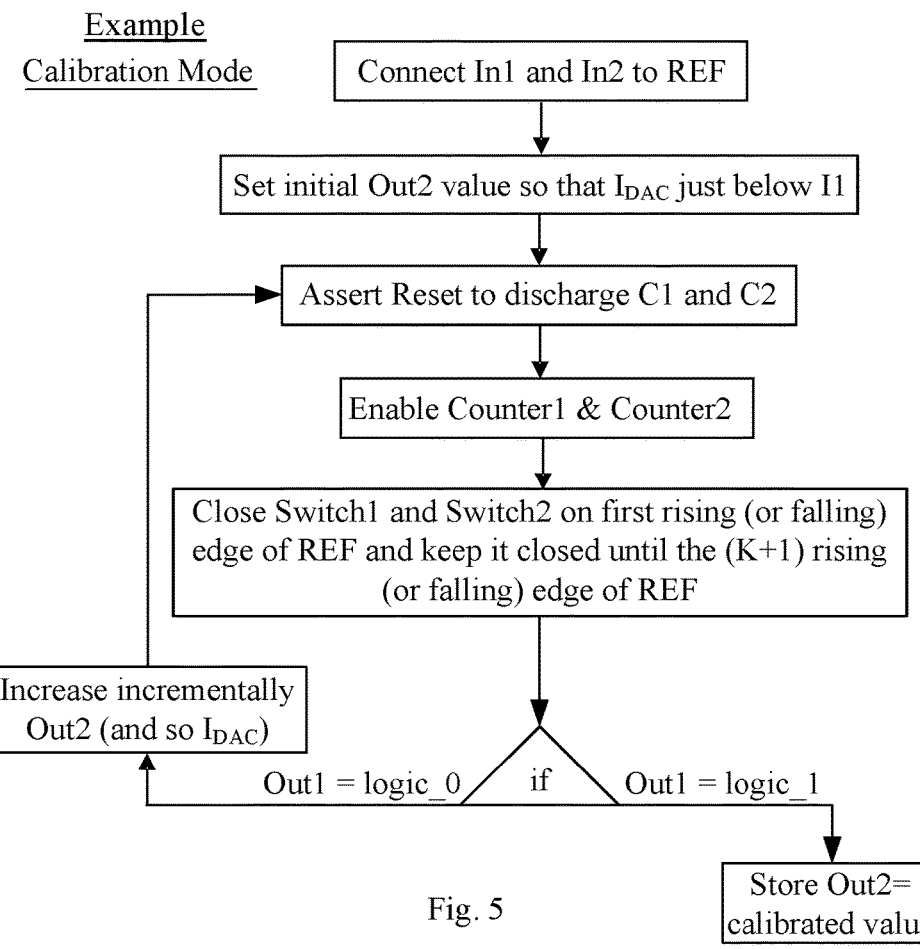
FIG. 5 illustrates, in flow diagram form, one example of a calibration mode of operation of the dual-function circuit of FIG. 3.

In a calibration mode of operation, illustrated in a generic form in FIG. 4 and by way of example in FIG. 5, our dual-function circuit 10 is adapted to minimize the effect of several non-idealities that may impact the desired measurement: the actual value of the current source, I1 (as opposed to its nominal value); the comparator input offset voltage, $V_{OS}$; the mismatch between the two capacitors, C1 and C2; and the possible difference between the switching times of the current switches, Switch1 and Switch2. In general, our calibration mode comprises the following steps:

1. Control connects In1 and In2 to a selected reference clock signal, REF: In1=In2=REF;
2. Control asserts Reset only long enough to discharge both capacitors, C1 and C2; and then enables both Counter1 and Counter2.
3. Control asserts S1 and S2 to close Switch1 and Switch2 so long as the outputs, $K_{In1}$ and $K_{In2}$, of both Counter1 and Counter2, respectively, are asserted.
4. Control develops a DAC control word, Out2, that sets the $I_{DAC}$ value just below the minimum possible value of I1, so that the comparator output goes to a logic_0, i.e., Out=0. As will be understood by those familiar with this art, the initial DAC control value can be estimated by taking into consideration its known nominal value and estimated process/voltage/temperature ("PVT") variations.
5. Control then selectively adjusts the DAC control word, Out2, to determine the minimum value for which the comparator output, Out1, goes to a logic_1; and then stores this value. After calibration, the voltages at the non-inverting and inverting comparator inputs, V+ and V−, respectively, can be expressed as follows:

$$V^+ = \frac{I_1}{C_1}(KT_{REF} + \Delta T_{SW1}) + V_{OS} = V^- = \frac{I_{DAC}}{C_2}(KT_{REF} + \Delta T_{SW2}) \quad [\text{Eq. 1}]$$

where:
- $\Delta T_{SWITCH1}/\Delta T_{SWITCH2}$ is the difference between the time it takes the respective Switch1/Switch2 to close and the time it takes to open, once it receives the appropriate switch control signal, S1/S2;
- $V_{OS}$=the offset voltage at the comparator input; and
- $T_{REF}$ is the period of the reference signal.

In general, calibration may be performed by operating our circuit 10 in either our frequency comparator mode or our early-late detector mode, but with the same signal applied to the inputs of both Counter1 and Counter2, and then adjusting $I_{DAC}$ until Out1 develops the desired output.

Figure 6:
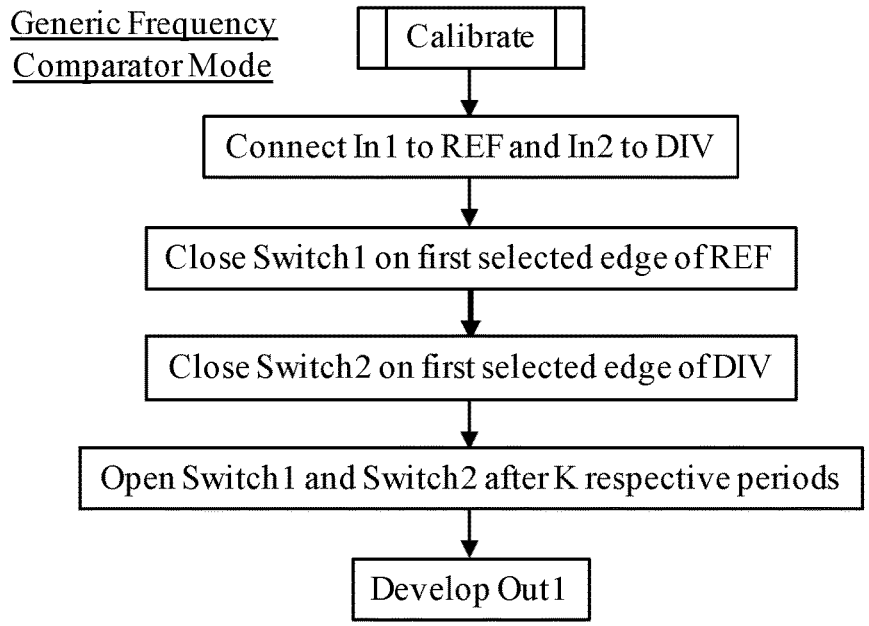
FIG. 6 illustrates, in flow diagram form, a generic form of a frequency comparator mode of operation of the dual-function circuit of FIG. 3.
Figure 7:
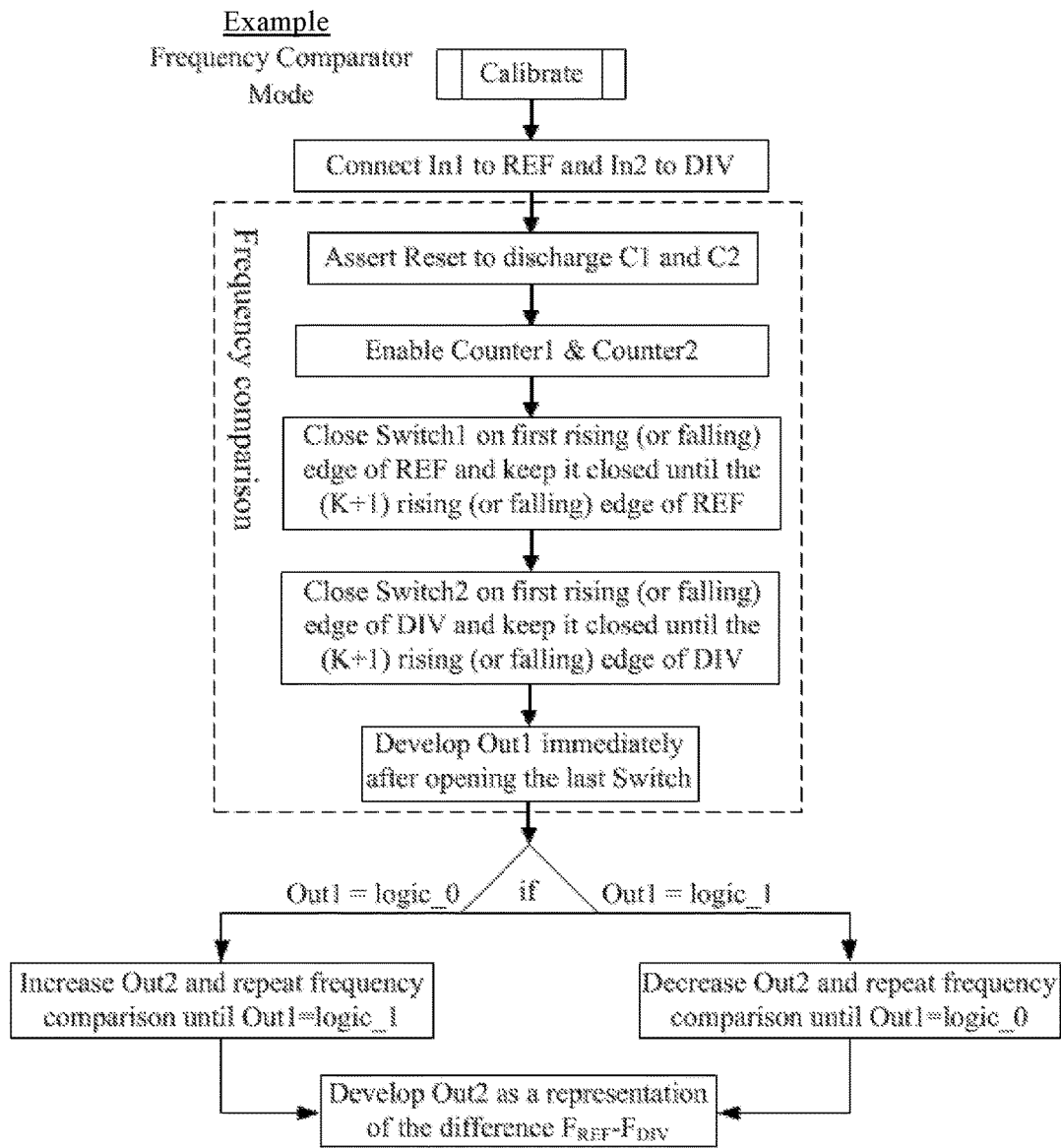
FIG. 7 illustrates, in flow diagram form, one example of a frequency comparator mode of operation of the dual-function circuit of FIG. 3.

In a frequency comparator mode of operation, illustrated in a generic form in FIG. 6 and in by way of example in FIG. 7, the logic state of the comparator output, Out1, indicates whether the frequency of the signal applied to In1 is larger (Out=Low) or smaller than the frequency of In2 signal (Out=High). For example, the reference, REF, remains connected to In1, while the signal to be compared against it, DIV, is applied to In2. Control provides the DAC control word, Out2, developed during calibration, so the DAC generates the current $I_{DAC}$ determined by Eq. 1. After calibration, Control discharges both capacitors C1 and C2, and then enables Counter1 and Counter2. Thus, the switches Switch1 and Switch2 are kept closed for periods of time equal to K periods of the signal applied to the respective inputs, In1 and In2, starting from their 1st rising edge. This relationship can be expressed as follows:

$$V^+ = \frac{I_1}{C_1}(KT_{REF} + \Delta T_{SW1}) + V_{OS}; V^- = \frac{I_{DAC}}{C_2}(KT_{DIV} + \Delta T_{SW2}) \quad [\text{Eq. 2}]$$

By substituting V+ with its equivalent expression in Eq. (1), which was developed using the same value of $I_{DAC}$, one obtains:

$$\Delta V = V^+ - V^- = \left[\frac{I_1}{C_1}(KT_{REF} + \Delta T_{SW1}) + V_{OS}\right] - \left[\frac{I_{DAC}}{C_2}(KT_{DIV} + \Delta T_{SW2})\right] = \left[\frac{I_{DAC}}{C_2}(KT_{REF} + \Delta T_{SW2})\right] - \left[\frac{I_{DAC}}{C_2}(KT_{DIV} + \Delta T_{SW2})\right] = \frac{I_{DAC}}{C_2}K(T_{REF} - T_{DIV}) \quad [\text{Eq. 3}]$$

Figure 8A:
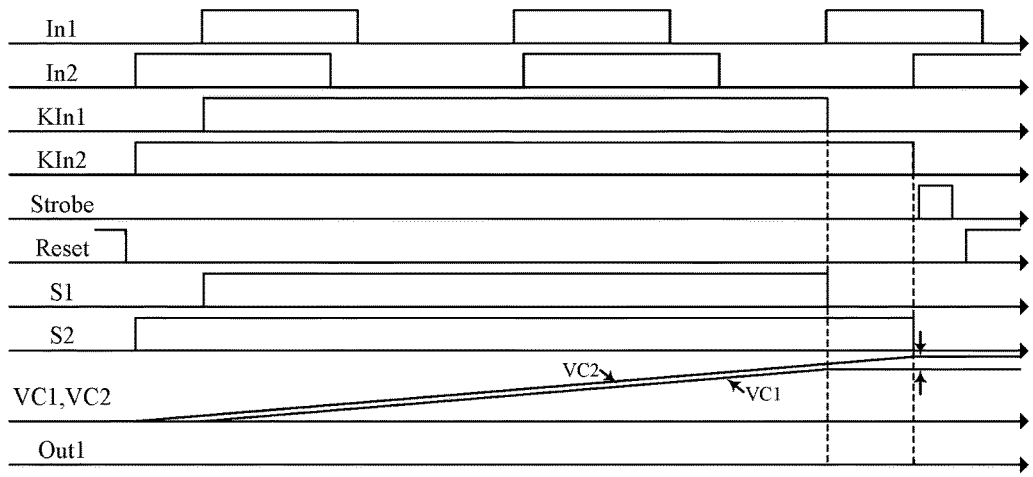
FIG. 8a and FIG. 8b, illustrates, in wave diagram form, examples of the operation of the dual-function circuit of FIG. 3 when operating in the frequency comparator mode illustrated in FIG. 6.
Figure 8B:
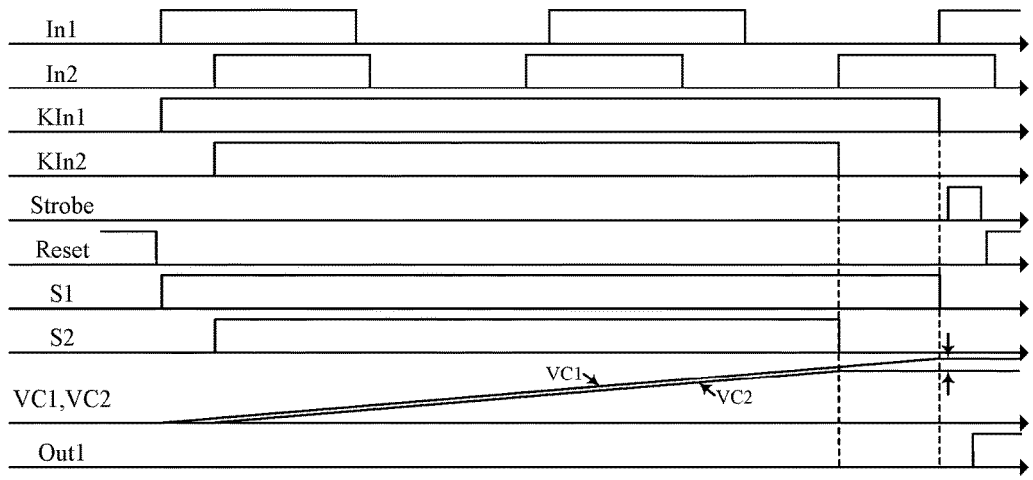

Illustrated by way of example in FIG. 8 is the evolution in time of the main signals within the circuit 10 when adapted to operate in accordance with the exemplary frequency comparator mode of operation illustrated in FIG. 6. The main point is that voltages on the two capacitors increase linearly over time as long as the Switch1 and Switch2 are closed; as the slopes are equal (ensured by the calibration procedure) the difference between these voltages is proportional to the difference between the periods of the signals applied to the In1 and In2 inputs, i.e., REF and DIV. In general, the period of the signal applied on In1 can be smaller (see, FIG. 8a) or larger (see, FIG. 8b) than that of the signal on In2. One can use the voltage ΔV to derive the actual value of difference between the periods (and from there the frequencies) of the signals applied to the inputs. For example, if this difference is required in analog format, one can simply employ a differential-input voltage amplifier adapted to sense the voltage ΔV and to amplify it, if necessary. If a digital format is required an analog-to-digital converter ("ADC") may be used. As will be evident to those skilled in this art, the circuit 10 comprises the essential elements a successive-approximation analog-to-digital converter ("SAR ADC") comprised of: a DAC, a comparator and a digital control facility. Thus, a SAR ADC could be implemented using the illustrated circuitry 10 by simply including the necessary functionality in the Control facility.

The principle of obtaining a digital representation of $T_{REF}-T_{DIV}$ by using directly the disclosed circuit is illustrated in FIG. 7: the steps required by the frequency comparison operation are included within a dotted-line rectangle, with the result of the comparison indicated by the state of Out1. By following the steps placed outside the dotted rectangle, one can derive a digital representation of the actual difference between the frequencies of $T_{REF}-T_{DIV}$.

The factor K, a non-zero positive integer, allows the user to tradeoff precision against response time:
- both the common-mode voltage level, 0.5*(V++V−) and the voltage difference at the comparator input, V+−V−, are proportional to K; and
- the time it takes the circuit to produce a valid output, that is, a state of OUT1 which will indicate whether the frequency of the signal applied to In1 is larger or smaller than the frequency of the signal applied to In2, is also proportional to K (excluding the calibration time).

In a physical implementation of our circuit 10, the value of K may be derived from the simulated or measured performance of the functional blocks within the circuit, or an optimum value may be found by using a test procedure performed during chip manufacturing or, in some embodiments, in the field.

In an early-late detector mode of operation, illustrated in a generic form in FIG. 9 and by way of example in FIG. 10, the logic state of the comparator output, Out1, indicates whether the 1st rising edge of the signal applied to In1 arrived sooner (Out1=logic_1) or later (Out1=logic_0) than the $1^{st}$ rising edge of the signal applied to In2. The reference, REF, remains connected to In1 while the signal to be compared against it, DIV, is applied to In2. The DAC control word again comprises the one obtained during calibration, so it generates the current $I_{DAC}$ determined by Eq. 1. After calibration, Control discharges both capacitors C1 and C2, and then enables Counter1 and Counter2. However, in our early-late mode of operation, Switch1 and Switch2 are kept closed for different periods of time, starting from the $1^{st}$ rising edge of the signal applied to the corresponding input and ending when the earliest $(K+1)^{th}$ rising edge of the In1 and In2 signals appears.

Figure 9:
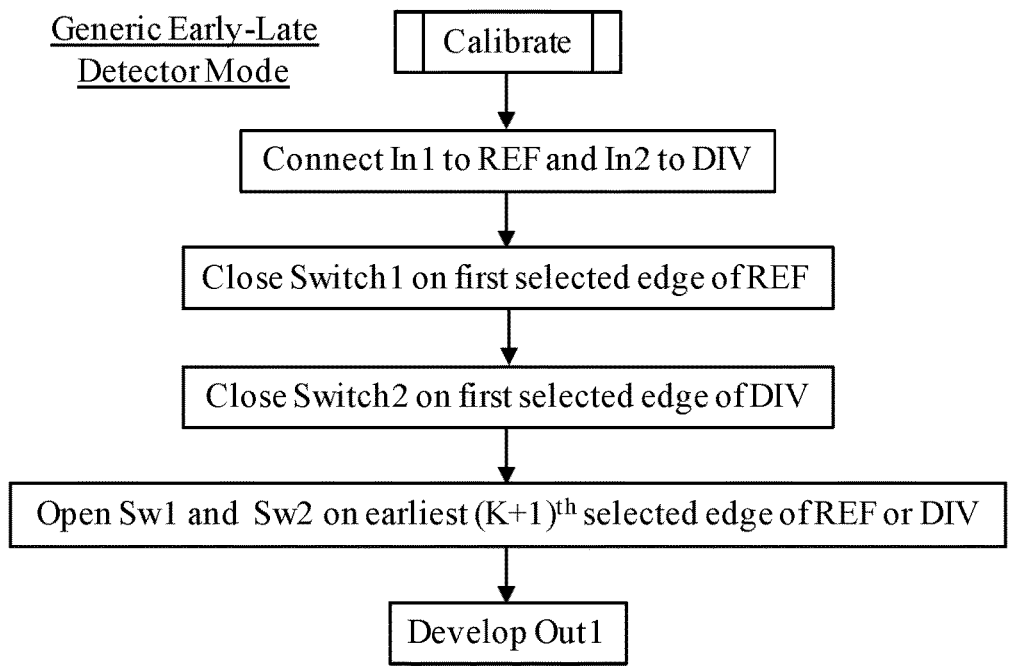
FIG. 9 illustrates, in flow diagram form, a generic form of an early-late detector mode of operation of the dual-function circuit of FIG. 3.
Figure 11A:
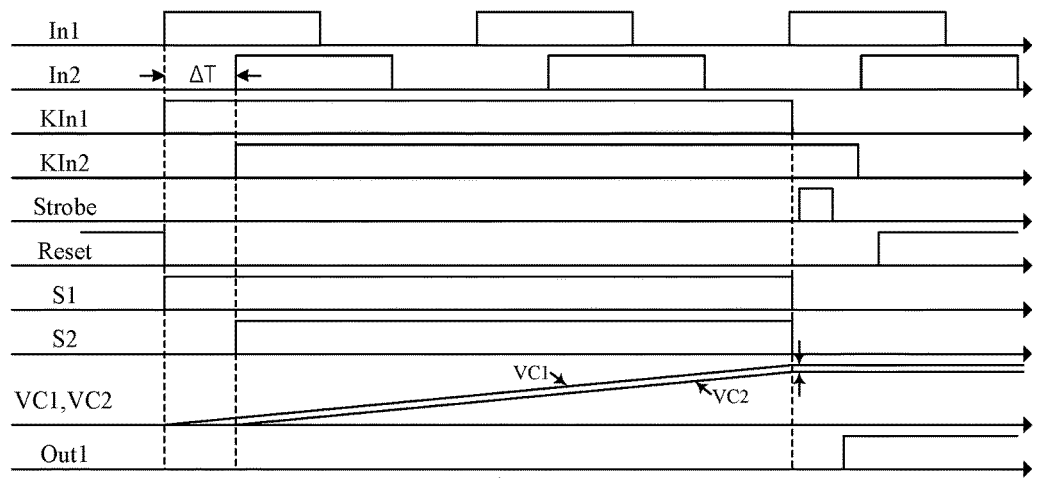
FIG. 11a and FIG. 11b, illustrates, in wave diagram form, examples of the operation of the dual-function circuit of FIG. 3 when operating in the early-late detector mode illustrated in FIG. 9.

Illustrated by way of example in FIG. 11 is the evolution in time of the main signals within the circuit 10 when adapted to operate in accordance with the exemplary early-late detector mode of operation illustrated in FIG. 9. The main point is that voltages on the two capacitors increase linearly in time as long as both Switch1 and Switch2 are closed; as the slopes are equal (ensured by the calibration procedure) the difference between these voltages is proportional to the difference in time between the $1^{st}$ rising edge of the In1 and In2 signals, called here $\Delta T$. Let us first assume that the REF signal applied to IN1 is earlier than the DIV signal applied to In2 (see, FIG. 11a):

$$V^+ = \frac{I_1}{C_1}(KT_{REF} + \Delta T_{SW1}) + V_{OS}; V^- = \quad \text{[Eq. 4]}$$
$$\frac{I_{DAC}}{C_2}(KT_{REF} - \Delta T + \Delta T_{SW2})$$

By substituting V+ with its equivalent expression in Eq. 1, one obtains a POSITIVE $\Delta V$:

$$\Delta V = V^+ - V^- = \left[\frac{I_{DAC}}{C_2}(KT_{REF} + \Delta T_{SW2})\right] - \quad \text{[Eq. 5]}$$
$$\left[\frac{I_{DAC}}{C_2}(KT_{REF} - \Delta T + \Delta T_{SW2})\right] = +\frac{I_{DAC}}{C_2}\Delta T$$

Figure 11B:
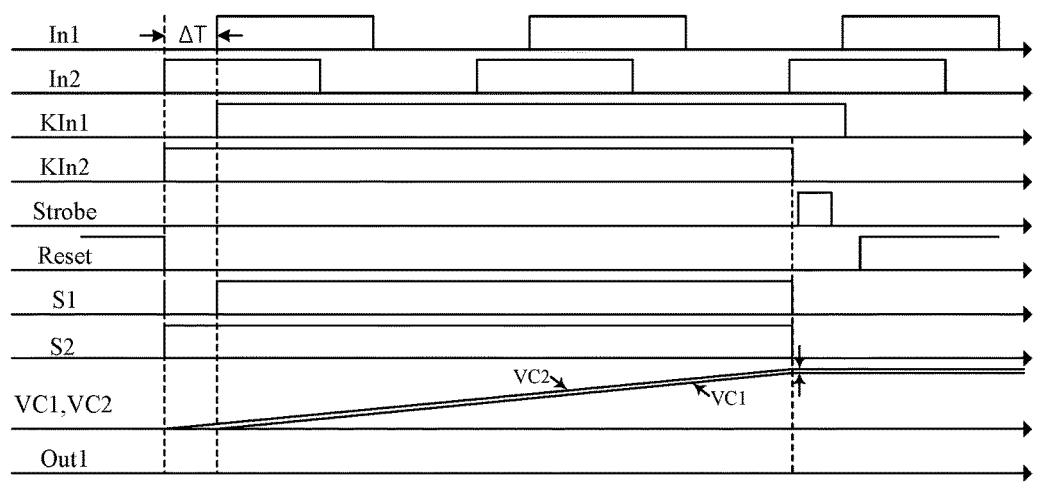

Let us see what happens if the DIV signal applied to the In2 input is earlier that the REF signal applied to the IN1 input (see, FIG. 11b). In this case one obtains:

$$V^+ = \frac{I_1}{C_1}(KT_{DIV} - \Delta T + \Delta T_{SW1}) + V_{OS}; V^- = \quad \text{[Eq. 6]}$$
$$\frac{I_{DAC}}{C_2}(KT_{DIV} + \Delta T_{SW2})$$

By substituting V$^-$ with its equivalent expression in Eq. 1 for $T_{REF} \approx T_{DIV}$, one obtains a NEGATIVE $\Delta V$:

$$\Delta V = V^+ - V^- \left[\frac{I_1}{C_1}(KT_{DIV} - \Delta T + \Delta T_{SW1}) + V_{OS}\right] - \quad \text{[Eq. 7]}$$
$$\left[\frac{I_1}{C_1}(KT_{DIV} + \Delta T_{SW1}) + V_{OS}\right] = -\frac{I_1}{C_1}\Delta T$$

If desired, one can use the voltage difference $\Delta V$ yielded by Eq. 6 or Eq. 7 to derive the actual value of the time difference $\Delta T$. For example, if this difference is required in analog format, one can simply employ a differential-input voltage amplifier adapted to sense the voltage $\Delta V$ and to amplify it, if necessary. If a digital format is required an ADC may be used. As will be evident to those skilled in this art, the circuit 10 comprises the essential elements a successive-approximation analog-to-digital converter ("SAR ADC") comprised of: a DAC, a comparator and a digital control facility. Thus, a SAR ADC could be implemented using the illustrated circuitry 10 by simply including the necessary functionality in the Control facility.

Figure 10:
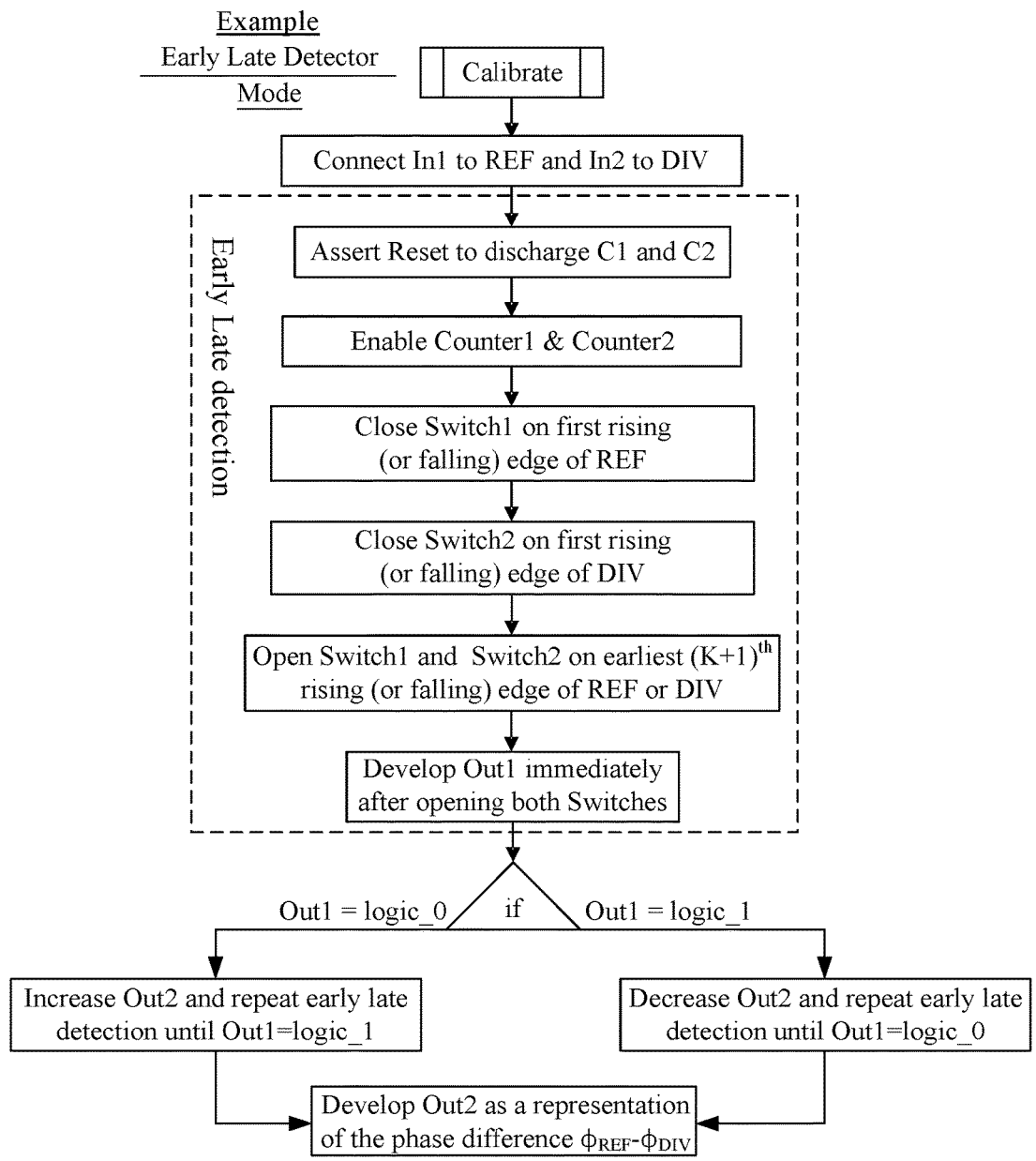
FIG. 10 illustrates, in flow diagram form, one example of an early-late detector mode of operation of the dual-function circuit of FIG. 3.

The principle of obtaining a digital representation of $\Delta T$ by using directly the disclosed circuit is illustrated in FIG. 10: the steps required by the early-late operation are included within a dotted-line rectangle, with the result of the comparison indicated by the state of Out1. By following the steps placed outside the dotted rectangle, one can derive a digital representation of the time difference between the REF and DIV signals, that is, the difference between the apparition of a chosen (raising or falling) edge of the REF and the corresponding edge of the DIV signal.

Figure 12:
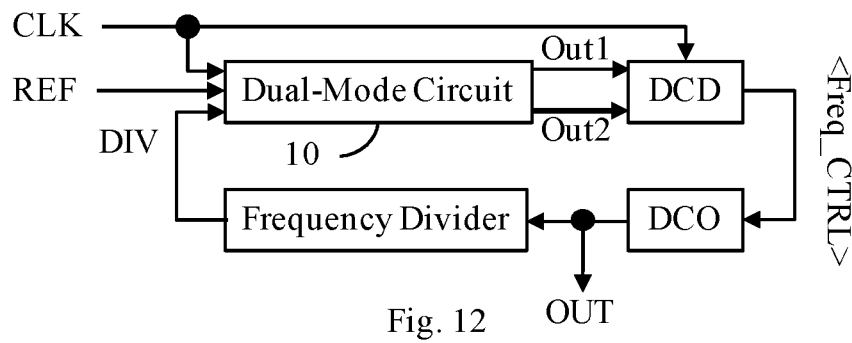
FIG. 12 illustrates, in block diagram form, one embodiment of a fast-lock frequency synthesizer adapted to use the dual-mode circuit of FIG. 3.

Although we have described our invention in the context of particular embodiments, one of ordinary skill in this art will readily realize that many modifications may be made in such embodiments to adapt either to specific implementations. As will be evident to those skilled in this art, our dual-function circuit 10 will operate equally as effectively if the timing is based on the falling edges of the respective signals rather than on the rising edges as we have described. We also recognize that our dual-mode circuit and method as disclosed herein can be easily adapted for use in many other applications requiring synchronization of a first signal to a second signal, including, by way of example, a fast-lock frequency synthesizer based on a digitally-controlled oscillator ("DCO"), as illustrated by way of example in FIG. 12. Such an embodiment may be adapted, for example, to generate a signal with the frequency N times larger than the frequency of the reference signal, REF: $F_{OUT}=N*F_{REF}$, where N is the divide ratio of the Frequency Divider, $F_{DIV}=F_{OUT}/N$, while maintaining the phase difference between the REF and DIV signals within set limits. In this context, the digital control word <Freq_CTRL> which determines the output frequency may be supplied to the DCO by a decoder, DCD, which in turn derives it from the output Out2 of the dual-mode circuit 10 described above. At power-up, the circuit 10 performs the calibration procedure described above, then enters the frequency comparator mode. The control word <Freq_CTRL> is set to an initial value by the DCD and the rest of the system is enabled. The circuit 10 compares the resulting $F_{DIV}$ against $F_{REF}$, and outputs the difference $F_{REF}-F_{DIV}$ in digital format at the multi-bit output Out2. Based on this difference, the DCD may derive a new <Freq_CTRL> digital word for the DCO, which brings the output frequency closer to the wanted value, $F_{DCO}=N*F_{REF}$. This operation is repeated until the circuit 10 detects no difference between $F_{DIV}$ and $F_{REF}$. Then, it changes its operating mode to early-late detector. In this mode, the DCD makes only small adjustments to the <Freq_CTRL> digital word it delivers to the DCO, based on the single-bit output Out1; if desired, the DCO may be adapted during this phase of operation to operate in a finer resolution mode. The clock signal required by both the circuit 10 and the DCD facility, CLK, can be derived from the output signal—for example, a divided-down version, DIV, found within the Frequency Divider.

Thus it is apparent that we have provided a dual-function circuit which significantly reduces the impact several non-idealities inherent to the physical implementation of the circuit may have on its operation. As a result, after calibration, the response of our dual-function circuit will be substantially independent of circuit component (e.g., capacitors, switches) mismatches or on the offset voltage associated with a differential-input amplifier or comparator. Further, we submit that our method and apparatus provides performance generally superior to the best prior art techniques.

What we claim is:

1. A method for operating a dual-function circuit in a frequency comparator mode, the method comprising the steps of:
   [1] connecting a first capacitor to a first charge source in response to a first pulse of a first periodic signal;
   [2] connecting a second capacitor to a second charge source in response to a first pulse of a second periodic signal;
   [3] developing an output as a function of the respective charges on the first and second capacitors;
   [4] disconnecting the first capacitor from the first charge source after K pulses of the first signal; and
   [5] disconnecting the second capacitor from the second charge source after K pulses of the second signal;
   whereby the output is indicative of the difference between the periods of the first and second signals.

2. A method for operating a dual-function circuit in an early-late detector mode, the method comprising the steps of:
   [1] connecting a first capacitor to a first charge source in response to a first pulse of a first periodic signal;
   [2] connecting a second capacitor to a second charge source in response to a first pulse of a second periodic signal;
   [3] developing an output as a function of the respective charges on the first and second capacitors; and
   [4] disconnecting both the first capacitor from the first charge source and the second capacitor from the second charge source after the earliest $(K+1)^{th}$ pulse of the first and second signals;
   whereby the output is indicative of the difference in time between the first pulses of the first and second signals.

3. A method for operating a dual-function circuit, the method comprising the steps of:
   [1] in a frequency comparator mode:
      [1.1] connecting a first capacitor to a first charge source in response to a first pulse of a first periodic signal;
      [1.2] connecting a second capacitor to a second charge source in response to a first pulse of a second periodic signal;
      [1.3] developing an output as a function of the respective charges on the first and second capacitors;
      [1.4] disconnecting the first capacitor from the first charge source after K pulses of the first signal; and
      [1.5] disconnecting the second capacitor from the second charge source after K pulses of the second signal;
      whereby the output is indicative of the difference between the periods of the first and second signals; and
   [2] in an early-late detector mode:
      [2.1] connecting a first capacitor to a first charge source in response to a first pulse of a first periodic signal;
      [2.2] connecting a second capacitor to a second charge source in response to a first pulse of a second periodic signal;
      [2.3] developing an output as a function of the respective charges on the first and second capacitors; and
      [2.4] disconnecting both the first capacitor from the first charge source and the second capacitor from the second charge source after the earliest $(K+1)^{th}$ pulse of the first and second signals;
      whereby the output is indicative of the difference in time between the first pulses of the first and second signals.

4. The method of any of the preceding claims further comprising an initial step of: [0] calibrating the second charge source with respect to the first charge source.

5. A dual mode circuit configured to perform the method of any of claims 1 to 3.

6. An UWB receiver comprising a dual mode circuit according to claim 5.

7. An UWB transceiver comprising an UWB receiver according to claim 6.

8. An UWB communication system comprising an UWB transceiver according to claim 7.

9. A fast-lock frequency synthesizer comprising a dual mode circuit according to claim 5.

10. A non-transitory computer readable medium including executable instructions which, when executed in a processing system, causes the processing system to perform the steps of a method according to any one of claims 1 to 3.

11. A method for operating a dual-function circuit in a frequency comparator mode, the method comprising the steps of:
    [1] receiving a first periodic input and a second periodic input;
    [2] connecting a first capacitor to a first charge source in response to a first pulse of said first periodic input;
    [3] connecting a second capacitor to a second charge source in response to a first pulse of said second periodic signal;
    [4] disconnecting said first capacitor from said first charge source after K pulses of said first periodic input;
    [5] disconnecting said second capacitor from said second charge source after K pulses of said second periodic input;
    [6] developing a first output as a function of charges on said first capacitor and said second capacitor, said first output being indicative of a sign of a frequency difference between said first periodic input and said second periodic input;
    [7] developing a second output as a function of said first periodic input and said second periodic input, said second output being a digital word proportional to a difference between a period of said first periodic input and a period of said second periodic input.

12. A method for operating a dual-function circuit in an early-late detector mode, the method comprising the steps of:
    [1] receiving a first periodic input and a second periodic input;
    [2] connecting a first capacitor to a first charge source in response to a first pulse of said first periodic input;
    [3] connecting a second capacitor to a second charge source in response to a first pulse of said second periodic input;
    [4] disconnecting both said first capacitor from said first charge source and said second capacitor from said second charge source after the earliest $(K+1)^{th}$ pulse of said first periodic input and said second periodic input;
    [5] developing a first output as a function of charges on said first capacitor and said second capacitors, said first output being indicative of a sign of a phase difference between said first periodic signal and said second periodic signal; and
    [6] developing a second output as a function of said first input and said second input, said second output being a digital word that is indicative of the difference in time between said first input and a phase of said second input.

13. A method for operating a dual-function circuit, the method comprising the steps of:
[1] in a frequency comparator mode:
  [1.1] receiving a first periodic input and a second periodic input;
  [1.2] connecting a first capacitor to a first charge source in response to a first pulse of said first periodic input;
  [1.3] connecting a second capacitor to a second charge source in response to a first pulse of said second periodic signal;
  [1.4] disconnecting said first capacitor from said first charge source after K pulses of said first periodic input;
  [1.5] disconnecting said second capacitor from said second charge source after K pulses of said second periodic input;
  [1.6] developing a first output as a function of charges on said first capacitor and said second capacitor, said first output being indicative of a sign of a frequency difference between said first periodic input and said second periodic input; and
  [1.7] developing a second output as a function of said first periodic input and said second periodic input, said second output being a digital word proportional to a difference between a period of said first periodic input and a period of said second periodic input; and
[2] in an early-late detector mode:
  [2.1] receiving a first periodic input and a second periodic input;
  [2.2] connecting a first capacitor to a first charge source in response to a first pulse of said first periodic input;
  [2.3] connecting a second capacitor to a second charge source in response to a first pulse of said second periodic input;
  [2.4] disconnecting both said first capacitor from said first charge source and said second capacitor from said second charge source after the earliest $(K+1)^{th}$ pulse of said first periodic input and said second periodic input;
  [2.5] developing a first output as a function of charges on said first capacitor and said second capacitors, said first output being indicative of a sign of a phase difference between said first periodic signal and said second periodic signal; and
  [2.6] developing a second output as a function of said first input and said second input, said second output being a digital word that is indicative of the difference in time between said first input and a phase of said second input.

* * * * *